United States Patent [19]

Ochi et al.

[11] Patent Number: 5,677,568
[45] Date of Patent: Oct. 14, 1997

[54] THIN IC CARD

[75] Inventors: Katsunori Ochi; Seiji Takemura, both of Itami; Syojiro Kodai; Tuguo Kurisu, both of Sanda, all of Japan

[73] Assignee: Mitsubishi Denki Kabushiki Kaisha, Tokyo, Japan

[21] Appl. No.: 994,957

[22] Filed: Dec. 22, 1992

[30] Foreign Application Priority Data

Dec. 26, 1991 [JP] Japan ................. 3-345327

[51] Int. Cl.⁶ ..................... H01L 23/02; H01L 23/22
[52] U.S. Cl. ................... 257/679; 257/678; 257/687
[58] Field of Search ..................... 257/679, 678, 257/687; 235/492, 380; 340/146.2; 174/52

[56] References Cited

U.S. PATENT DOCUMENTS

| | | | |
|---|---|---|---|
| 4,086,752 | 5/1978 | Kishimoto | 174/52 |
| 4,238,848 | 12/1980 | Yamaguchi et al. | 368/276 |
| 4,539,472 | 9/1985 | Poetker et al. | 235/488 |
| 4,575,621 | 3/1986 | Dreifus et al. | 235/380 |
| 4,686,358 | 8/1987 | Seckinger et al. | 235/382 |
| 4,822,988 | 4/1989 | Gloton | 235/492 |
| 4,843,226 | 6/1989 | Kato et al. | 235/492 |
| 4,918,631 | 4/1990 | Hara et al. | 365/708 |
| 4,974,120 | 11/1990 | Kodai et al. | 361/392 |
| 5,013,900 | 5/1991 | Hoppe | 235/492 |
| 5,018,051 | 5/1991 | Yamada et al. | 361/393 |

FOREIGN PATENT DOCUMENTS

| | | |
|---|---|---|
| 0267826 | 5/1988 | European Pat. Off. . |
| 0340100 | 11/1989 | European Pat. Off. . |
| 4037555 | 5/1991 | France . |
| 227822 | 9/1985 | Germany . |
| 2661761 | 11/1991 | Germany . |
| 61-222712 | 10/1986 | Japan . |
| 62-32094 | 2/1987 | Japan . |

*Primary Examiner*—Mahshid D. Saadat
*Assistant Examiner*—T. M. Arroyo
*Attorney, Agent, or Firm*—Leydig, Voit & Mayer

[57] ABSTRACT

A thin IC card includes a circuit board on which functional parts are mounted and a through-hole defining an edge of a battery lodging section in which a battery is disposed, the circuit board being embedded in a molding-resin section with the reverse surface of the board exposed. The battery lodging section is aligned with the through-hole of the circuit board. Electrical connections between the circuit board and the battery are effected in a recess or cutouts in the circuit board. The battery is embedded in the lodging section using an expandable resin to make the card surface flat.

7 Claims, 9 Drawing Sheets

; # THIN IC CARD

BACKGROUND OF THE INVENTION

1. Field of the Invention

This invention relates to a thin IC card having a built-in battery and, in particular, to a thin IC card having a functional part and battery completely embedded in resin.

2. Description of the Related Art

FIG. 16 is a sectional view of a conventional thin IC card (hereinafter "IC card"). An IC card 1 includes a circuit board 2 lodged and secured in position inside a plastic frame 11. Mounted on the circuit board 2 are: an IC package 3, serving as the functional part, a battery 4, and another part 5. Panels 60, consisting of thin metal sheets, are glued to the upper and lower surfaces of the frame 11 by an adhesive (not shown).

FIG. 17 shows a sectional view of another conventional IC card. In this IC card 1, the spaces defined between the circuit board 2, on which the battery 4 and the other part 5 are mounted, and the upper and lower panels 60, are filled with curable resin 12 by potting or the like, thereby forming a solid-type IC card. In a non-contact IC card having a built-in communication device, such as a coil, use of metal sheets as the panels is restricted. In view of this, plastic sheets have been used as the panels 60 on the surfaces of the IC card and, to enhance the strength thereof, the panels 60 have been made thick or, as in the IC card shown in FIG. 17, the gaps between the circuit board 2 and the upper and lower panels 60 have been filled with the resin 12.

A problem with the conventional IC card shown in FIG. 16 is that, as it has the gaps between the panels 60 and the circuit board 2, the panels are liable to be distorted or bent when an external force is applied to the surfaces of the card. When the IC card is formed as a non-contact card for communicating information by electromagnetic waves, the panels must be made of a non-metal material. In that case, panels of synthetic resin which are very thick are used to ensure the requisite strength, with the result that the entire IC card is rather thick.

In the case of the IC card shown in FIG. 17, the inner spaces, as mentioned above, are filled with resin to ensure the requisite strength. However, it is difficult to pour a quantity of resin in the spaces which is just enough to fill the spaces, i.e., neither too much nor too little resin. This is particularly true in the case of a card whose panels have to be made of thermoplastic resin material. In such a case, it is difficult to make the surfaces of the card flat and parallel. Further, when the resin contracts as a result of curing, a part of each of the card surfaces may be drawn inwardly. Due to the presence of the functional part inside the card, such a contraction will result in the generation of irregularities on the card surfaces. Further, there is the problem of resin leaking through the joints between the panels and the frame. Apart from this, a number of complicated processes are required to fill the inner spaces with resin, such as blending and curing. In addition, when the card is being filled with resin at a high temperature, heat is applied to the battery, thereby deteriorating the function of the battery.

SUMMARY OF THE INVENTION

This invention has been made with a view toward solving the above problems. It is an object of this invention to provide a thin IC card with flat surfaces and a production method for the same which allow the battery to be easily mounted in the card without being damaged.

In order to achieve the above object, there is provided, in accordance with this invention, a thin IC card having a built-in battery, the IC card comprising: a circuit board having obverse and reverse main surfaces on one of which a functional part is mounted, and a through-hole portion constituting an edge around a lodging section in which the battery is lodged, a circuit pattern being formed at least on that main surface of the circuit board on which the functional part is mounted; a molding-resin section formed as a card in such a way that the circuit board and the functional part are embedded therein, exposing that main surface of the circuit board on which the functional part is not mounted, the lodging section in which the battery is lodged being formed in the molding-resin section in such a way that the through-hole portion of the circuit board constitutes an inlet of the lodging section; and battery connection means for firmly supporting the battery in the lodging section and for electrically connecting the battery to the circuit pattern on the circuit board.

In this invention by the battery connection means electrically connects the circuit pattern on the circuit board to the battery through a recess or a cutout on the circuit board.

In another embodiment of this invention, the section between the battery and the lodging section is filled with an expandable resin, which forms a flat surface together with the circuit board surface.

In still another embodiment of this invention, a decorative sheet is disposed on that main surface of the circuit board on which the functional part is not mounted, the molding-resin section being formed in such a way that the circuit board, on which the functional part is mounted, and the decorative sheet are embedded in such a way that one side of the decorative sheet is exposed, with the exposed main surface of the decorative sheet and the molding-resin section forming one flat surface.

This invention also covers a method of producing such a thin IC card.

In the thin IC card of this invention, a through-hole portion constituting an inlet for the battery lodging section is formed on the circuit board, and the functional part of the circuit board is embedded in the molding-resin section. At the same time, the battery lodging section is formed through the intermediation of the through-hole portion, so that the lodging section can be formed in correspondence with the configuration of the battery.

Further, a recess section is provided in the peripheral edge around the through-hole portion of the circuit board, and the electrical connection between the circuit pattern of the circuit board and the battery is effected through this recess section, thereby making the card surface flat, including the battery lodging section.

The battery lodging section is filled with an expandable resin, whereby the battery is more firmly fixed inside the lodging section and the card surface can be kept flatter, thereby realizing a highly reliable battery lodging section.

Further, in the thin IC card production method of this invention, the battery is mounted on the card and electrically connected to the circuit board after the integral molding of the card, so that the battery can be easily mounted and is free from damage by heat during the integral molding.

DESCRIPTION OF THE PREFERRED EMBODIMENTS

Embodiments of this invention will now be described with reference to the accompanying drawings.

Figure 1:
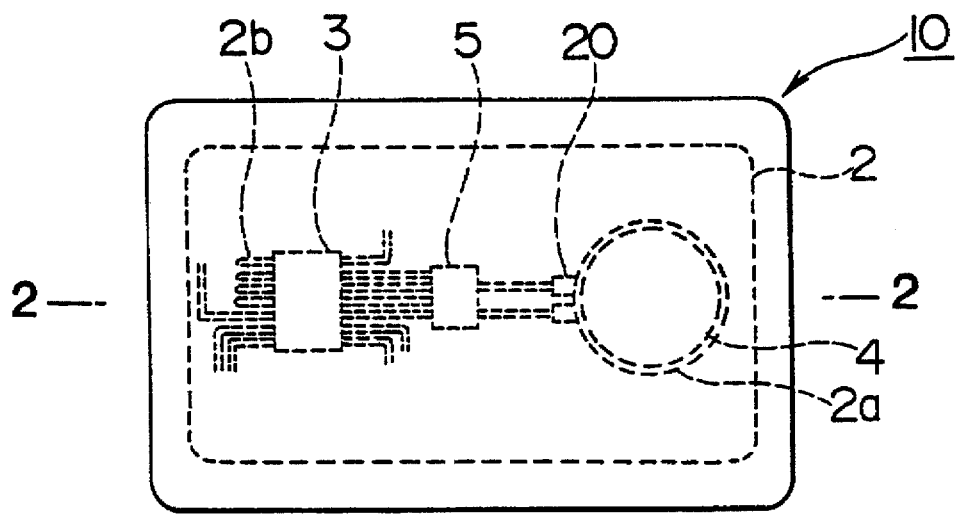
FIG. 1 is a schematic plan view of a thin IC card according an embodiment of this invention.
Figure 2:
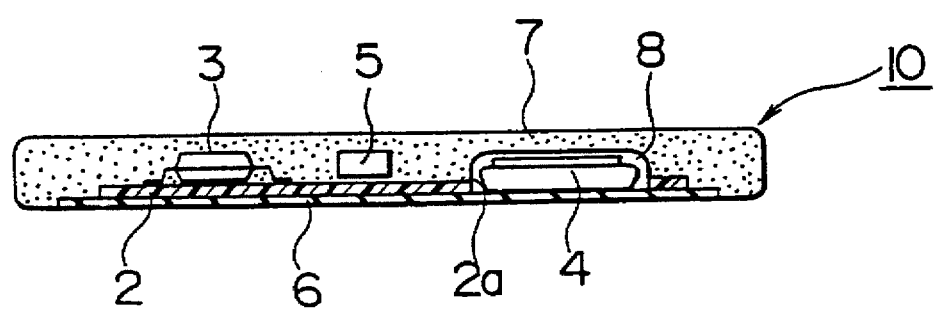
FIG. 2 is an enlarged sectional view taken along the line 2—2 of FIG. 1.

FIGS. 1 and 2 are schematic diagrams showing a thin IC card according to an embodiment of this invention. FIG. 1 is a plan view of the IC card, and FIG. 2 is an enlarged sectional view taken along the line 2—2 of FIG. 1. The components which are the same as or equivalent to those of the conventional examples are referred to by the same reference numerals, and a description of such components will be omitted. The IC card 10 has obverse and reverse main surfaces. Mounted at one of these main surfaces (hereinafter "the mounting surface") on the circuit board 2 are an IC package 3, which serves as the functional part, and another part 5, with a circuit pattern 2b being formed at least at the mounting surface on the circuit board 2. When a circuit pattern is also formed on that circuit board 2 where no IC package, is mounted (hereinafter "the reverse surface"), the circuit patterns on the obverse and reverse surfaces are connected to each other through through-holes (not shown) or the like. Further, the circuit board 2 has a through-hole portion 2a formed in correspondence with the configuration of the battery 4. This through-hole portion is a peripheral edge (the inlet) of a lodging section 8 for receiving the battery 4. Formed on a part of the periphery of the through-hole portion 2a are a pair of electrodes 20 for battery connection.

Figure 4A:
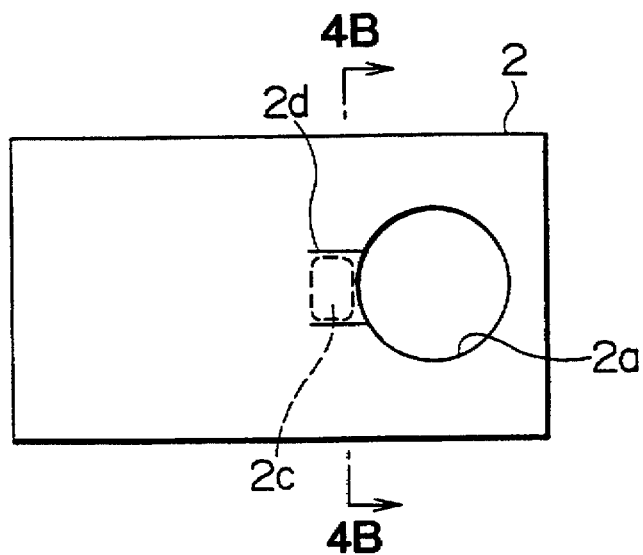
FIG. 4A is a plan view of the circuit board shown in FIG. 3.
Figure 4B:
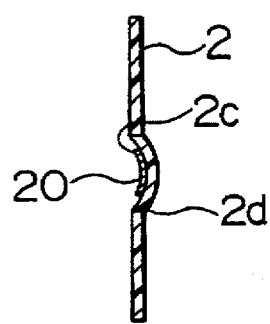
FIG. 4B is a sectional view taken along the line 4B—4B of FIG. 4A.
Figure 5:
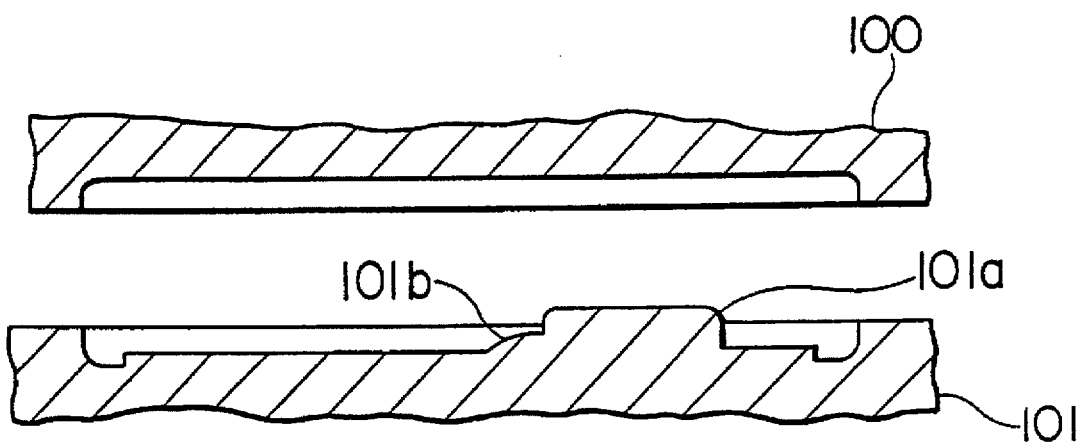
FIG. 5 is sectional view of a mold for producing the thin IC card shown in FIG. 3.
Figure 6:
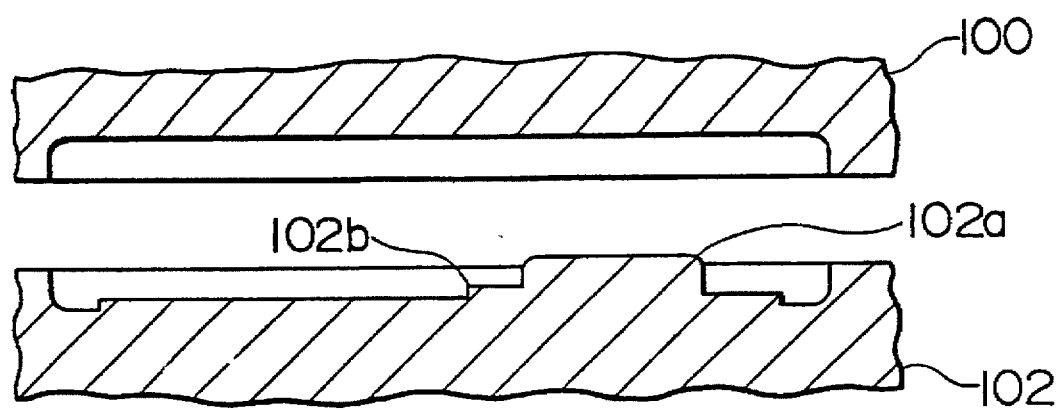
FIG. 6 is sectional view of a mold for producing the thin IC card shown in FIG. 7.

The IC package 3 and the other part 5 are integrally formed with the circuit board 2, which is embedded in a molding-resin 7 by injection molding using a mold as shown in FIGS. 5 and 6. In this injection molding, the battery lodging section 8, the peripheral edge of which includes the through-hole portion 2a, is formed by a protrusion 101a or 102a provided inside the mold. The lodging section 8 has a configuration corresponding to that of the battery 4 lodged therein and its depth is such that the exposed surface of the battery 4 when lodged is substantially flush with the reverse surface of the circuit board 2. When the battery 4 has been lodged in the lodging section 8 and battery-connection terminals 40 of the battery 4 have been connected to the battery-connection electrodes 20 provided on the circuit board 2 (see FIGS. 4A, 4B, 9 and 10), the reverse side of the circuit board 2 is covered with a decorative sheet 6 of plastic or paper having a design indicating the kind of card, thereby completing the IC card 10. Liquid-crystal polymers are one example of the molding resin used.

Figure 3:
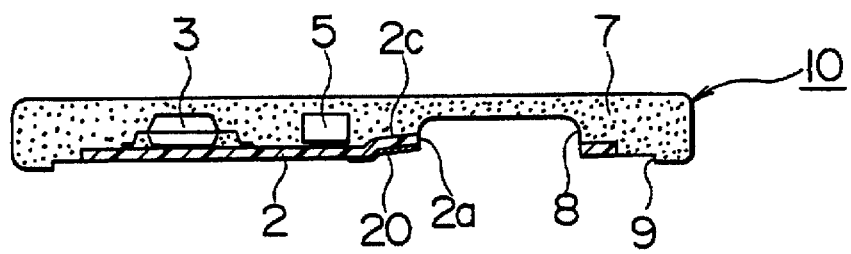
FIG. 3 is a sectional view of a thin IC card according to this invention, showing an embodiment of the structure for connecting the circuit board to the battery.

FIGS. 3, 4A, and 4B show a first embodiment of the structure for the electrical connection between the circuit board and the battery of the IC card of this invention, shown in FIGS. 1 and 2. FIG. 5 is a sectional view showing an example of the mold for resin molding used in the production of the IC card of this embodiment.

FIG. 3 is a sectional view showing the IC card 10. In this drawing, the circuit board 2, having the functional part mounted thereon and the through-hole portion formed therein, has been embedded in the molding-resin section 7, and the battery 4 has not been lodged in the lodging section 8 yet. Referring to FIG. 3, a decorative-sheet fitting section 9 for providing the decorative sheet 6 is formed on the reverse side of the molding-resin section 7, in which the circuit board 2 is embedded. The depth of the decorative-sheet fitting section 9 is substantially the same as the thickness of the decorative sheet 6 so that the exposed surface of the decorative sheet 6 when fitted is flush with the molding-resin section 7.

Figure 9:
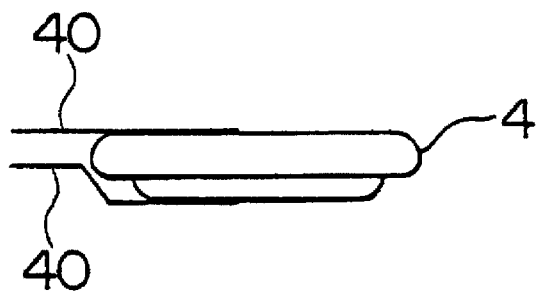
FIG. 9 is a side view of a battery used in this invention.
Figure 10:
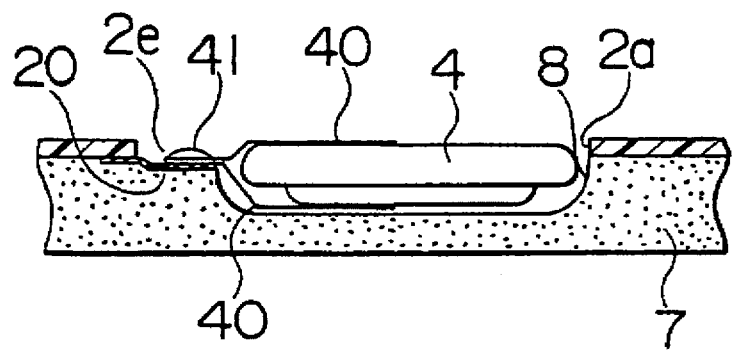
FIG. 10 is a partial sectional view showing how the battery is lodged in the thin IC card shown in FIG. 7.

FIGS. 4A and 4B exclusively show the circuit board 2 of the IC card shown in FIG. 3. FIG. 4A is a plan view seen from the side of the molding-resin section 7. FIG. 4B is a sectional view taken along the line 4B—4B of FIG. 4A. The right-hand side of FIG. 4B corresponds to the upper side of the IC card shown in FIG. 3. Referring to FIG. 4A, formed on a part of the periphery of the through-hole section 2a is a recess 2c for soldering or the like to electrically and mechanically connect the battery 4 to the battery-connection electrodes 20 on the circuit board 2. As shown in FIG. 3, the recess 2c is formed on the side of the molding-resin section 7 when the above-described injection molding is conducted. As shown in FIG. 4B, the battery-connection electrodes 20 are exposed inside the recess 2c, and are connected to the circuit pattern 2b on the circuit board 2. As shown in FIGS. 9 and 10, the battery-connection terminals 40 are connected to the battery-connection electrodes 20 by solder 41, which is a conductive material. The battery-connection electrodes 20 and the battery-connection terminals 40 are generally provided one pair each.

FIG. 5 shows an example of the mold for producing the IC card of this embodiment. The mold is composed of upper and lower mold sections 100 and 101. Formed on the lower mold section 101 are the protrusion 101a for forming the battery lodging section 8 and a protrusion 101b for deforming a part of the circuit board 2 into the recess 2c. These mold sections are shown only schematically, and the means for securing the circuit board 2 inside the mold and the injection outlet for the resin are omitted.

When the functional part has been mounted on the circuit board 2 and the through-hole portion 2a has been formed therein, the circuit board 2 is put in the mold to undergo injection molding. At this time, the protrusion 101a of the lower mold section 101 is fitted into the through-hole portion 2a and, in this condition, the circuit board 2 is secured inside the mold. Thus, when injection molding is completed, the lodging section 8, whose peripheral edge includes the through-hole portion 2a of the circuit board 2, has been formed in the molding-resin section 7. At the same time, the low, dike-like protrusion 101b, adjacent to the protrusion 101a of the lower mold section 101, causes a part of the periphery of the through-hole portion 2a of the circuit board 2 to be deformed into the recess 2c, which is situated where the battery-connection electrodes 20 are located. The configuration of the lodging section 8 and the recess 2c can be easily changed by changing the configuration of the protrusions 101a and 101b of the lower mold section 101.

The battery 4 is lodged in the lodging section 8 of the IC card 10 formed as an integral unit. Next, the battery-connection terminals 40, extending from the battery 4, are electrically and mechanically connected to the battery-connection electrodes 20 by the solder 41 shown in FIG. 10 or the like, thereby securing the battery 4 inside the lodging section 8. The recess 2c must be deep enough to cover the height of the joint between the electrodes and the terminals. In practice, the recess must have a depth of approximately 0.3 mm. Molding was experimentally performed using a polyimide-film printed circuit board having a thickness of 0.2 mm as the circuit board 2. By deforming the circuit board itself, a battery-connection recess having a desired depth could be easily formed.

When the circuit board 2 is hard to deform, it is expedient to provide a slit 2d (see FIGS. 4A and 4B) on either side of that section of the circuit board 2 where the recess 2c is to be formed. The decorative sheet 6, which is to be attached to the reverse side of the circuit board 2, may be omitted. In that case, there is no need to form the decorative-sheet fitting section 9 on the molding-resin section 7 when conducting resin molding.

Figure 7:
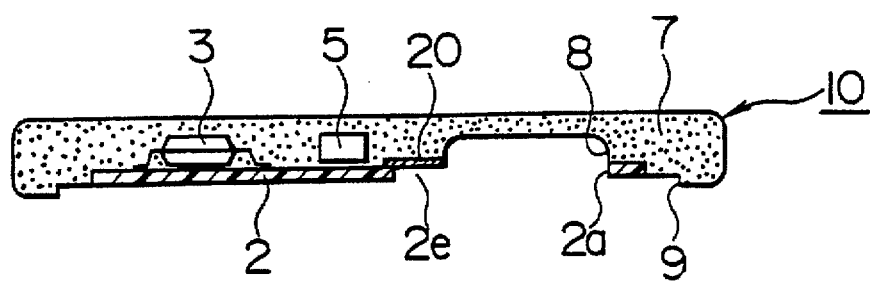
FIG. 7 is a sectional view, taken along the line 7—7 of FIG. 8A, of a thin IC card according to this invention, showing another embodiment of the structure for connecting the circuit board to the battery.
Figure 8A:
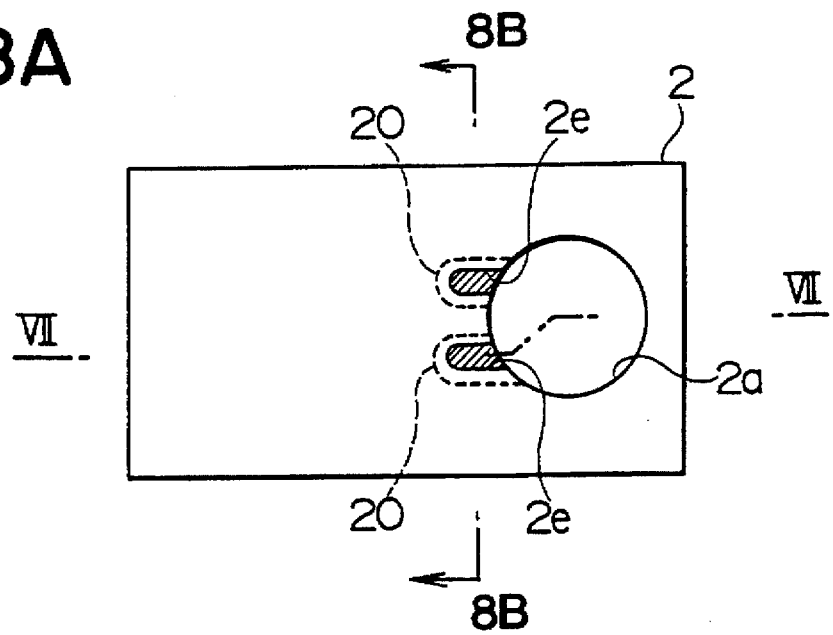
FIG. 8A is a plan view of the circuit board shown in FIG. 7.
Figure 8B:
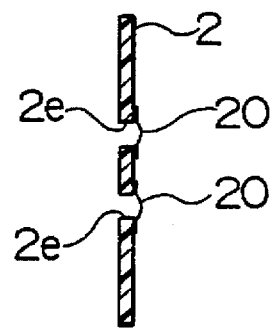
FIG. 8B is a sectional view taken along the line 8B—8B of FIG. 8A.

FIGS. 7 and 8 show a second embodiment of the structure of this invention for connecting the circuit board and the battery of the IC card to each other. FIG. 6 is a sectional view showing an example of the mold used in resin molding in the production of an IC card according to this embodiment. FIG. 7 is a sectional view showing the IC card 10 in a condition prior to lodging the battery 4 in the lodging section 8. FIGS. 8A and 8B exclusively show the circuit board 2 of the IC card of FIG. 7. FIG. 8A is a plan view of the circuit board as seen from the reverse side. FIG. 8B is a sectional view taken along the line 8B—8B of FIG. 8A. The right-hand side of FIG. 8B corresponds to the upper side of the IC card shown in FIG. 7, which is a sectional view taken along the line 8B—8B 0f FIG. 8A.

In this embodiment, a pair of cutouts 2e for battery connection are located on a part of the periphery of the through-hole portion 2a of the circuit board 2. A pair of flat battery-connection electrodes 20 consisting of copper foils are provided on the mounting side of the circuit board 2, covering the bottom sections of the cutouts 2e. The battery-connection electrodes 20 are connected to the circuit pattern 2b (see FIG. 1) on the mounting surface of the circuit board 2. The battery 4 shown in FIGS. 9 and 10 is lodged in the lodging section 8, and the battery-connection terminals 40 are connected to the battery-connection electrodes 20 by solder 41, a conductive material.

FIG. 6 shows an example of the mold used in the production of the IC card of this embodiment. It is composed of upper and lower mold sections 100 and 102. Provided on the lower mold section 102 are a protrusion 102a for forming the battery lodging section 8 and a pair of protrusions 102b which engage the cutouts 2e of the circuit board 2 when the IC card is formed as an integral unit by injection molding. The protrusions 102b prevent intrusion of molding resin into the cutouts 2e during injection molding, thereby forming recesses for electrically connecting the circuit board 2 to the battery 4. The electrodes 20 are exposed on the bottom surfaces of the recesses.

When the functional part has been mounted on the circuit board 2 and the through-hole portion 2a and the cutouts 2e have been formed therein, the circuit board 2 is put in the mold to undergo molding. At this time, the protrusion 102a of the lower mold section 102 is fitted into the through-hole portion 2a of the circuit board 2, and the protrusions 102b are fitted into the cutouts 2e and, in this condition, the circuit board 2 is secured within the mold. Thus, when injection molding is completed, the lodging section 8, whose periphery includes the through-hole portion 2a of the circuit board 2, has been formed in the molding-resin section 7. At the same time, due to the protrusions 102b, adjacent to the protrusion 102a of the lower mold section 102 and having a size corresponding to the cutouts 2e, the cutouts 2e remain as recesses, on the bottom surfaces of which the battery-connection electrodes 20 are exposed.

The battery 4 is lodged in the lodging section 8 of the IC card 10 formed as an integral unit. FIG. 9 is a side view of a coin-shaped battery 4. In the drawing, the lower side of the battery 4 is the anode. Extending from both electrodes of the battery 4 are the battery-connection terminals 40, the ends of which are connected to the electrodes 20 of the cutouts 2e of the circuit board 2. FIG. 10 is a sectional view showing the connected state. The battery 4 is lodged in the lodging section 8, and the ends of the battery-connection terminals 40 are connected to the battery-connection electrodes 20, the connection being effected inside the cutouts 2e by means of solder 41. Thus, as can be seen from FIG. 10, the battery connecting portions and the battery do not protrude beyond the reverse surface of the circuit board 2, so that the card surface exhibits no surface irregularities. Then, the decorative sheet 6 is attached to the reverse side of the circuit board 2 as needed.

When the circuit board 2 has a sufficient thickness, the battery-connection electrodes 20 may be flat, as shown in FIG. 7. Generally speaking, however, the circuit board 2 is as thin as 0.2 mm, whereas in many cases the cutouts 2e must be 0.3 mm deep or more in order to accommodate the electrode-connecting sections including the battery-connection electrodes 20, the terminals 40 and the solder 41. In view of this, it is expedient to impart a dome-like shape to the battery-connection electrodes 20, as shown in FIG. 8B, making the depth of the battery-connection recesses, defined by the cutouts 2e, approximately 0.4 mm. This can be easily realized, for example, by increasing the height of the protrusions 102b of the lower mold section 102 shown in FIG. 6.

Figure 11:
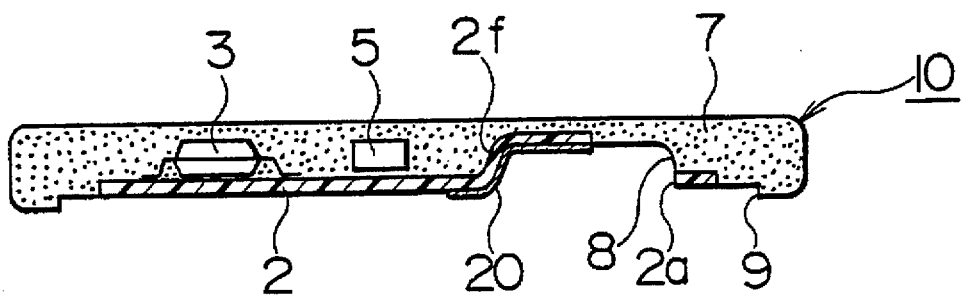
FIG. 11 is a sectional view of a thin IC card according to this invention, showing still another embodiment of the structure for connecting the circuit board to the battery.
Figure 12:
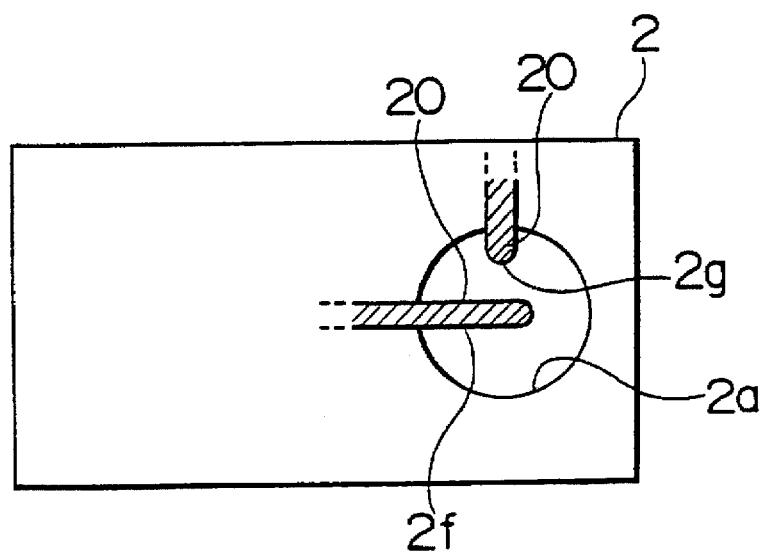
FIG. 12 is a plan view of the circuit board shown in FIG. 11 prior to resin molding.

FIGS. 11 and 12 show a third embodiment of the structure of this invention for electrically connecting the circuit board and the battery of the IC card to each other. FIG. 11 is a sectional view showing the IC card 10 prior to lodging the battery in the lodging section 8. FIG. 12 is a plan view, as seen from the reverse side, showing the circuit board of the IC card of FIG. 11 exclusively. In FIG. 12, the circuit board 12 is shown prior to injection molding.

In this embodiment, a part of the circuit board 2 is formed as two projections 2f and 2g, which extend from the periphery of the through-hole section 2a toward the center thereof. Formed on the surfaces of the projections 2f and 2g facing the battery (not shown) are battery-connection electrodes 20 extending from the reverse surface of the circuit board. When the circuit board 2 is put in the mold and injection molding is performed, the projections 2f and 2g are pressed and bent by the protrusion formed on the lower mold section and deformed along the inner surface of the lodging section 8, as shown in FIG. 11. This enables the battery-connection electrodes 20, formed on the projections 2f and 2g, to come into contact with the electrodes of the battery lodged in the lodging section 8. When the battery has been lodged in the lodging section, the battery and the battery-connection electrodes 20 are electrically connected to each other. In this way, it is possible to lodge the battery without allowing it to protrude beyond the reverse surface of the circuit board 2.

The anode of the battery may be on the upper or lower side of the battery. The configuration of the lodging section can be changed in accordance with the configuration of the battery by changing the configuration of the protrusion of the mold accordingly. Further, by changing the configuration of the protrusion of the mold, it is possible to provide the lodging section with separate recesses into which the battery-connection electrodes are to be fitted.

Figure 13:
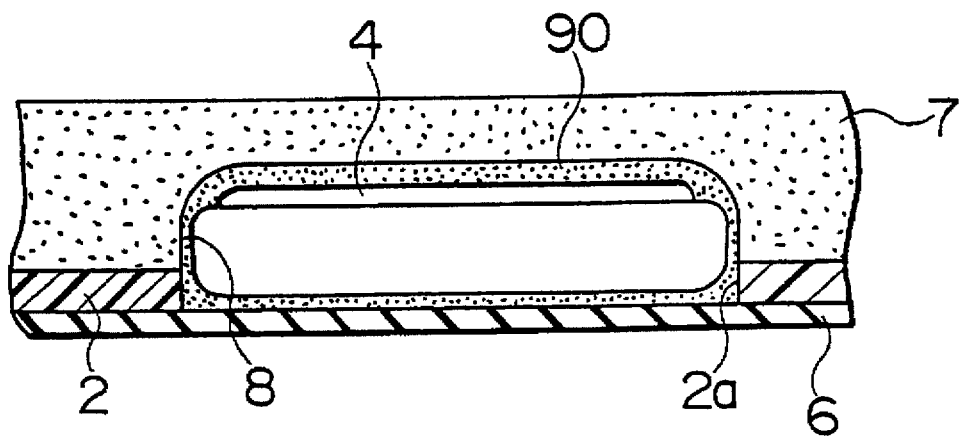
FIG. 13 is a partial sectional view of a thin IC card according to another embodiment of this invention, showing the battery lodging section.

Further, in accordance with this invention, it is also possible, as shown in FIG. 13, to put unexpanded expandable resin 90 in the lodging section 8 accommodating the battery 4. When expanded, this resin fills the gap between the lodging section 8 and the battery 4. This will be described with reference to FIGS. 13 to 15.

Figure 14:
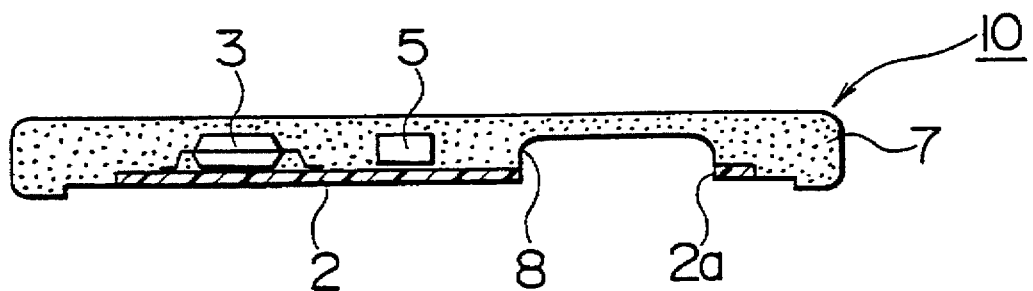
FIG. 14 is a sectional view of the thin IC card shown in FIG. 13 prior to embedding its battery in expandable resin.

FIG. 13 is an enlarged sectional view of the lodging section 8, in which the battery 4 is accommodated. The gap between the lodging section 8 and the battery 4 is filled with the expandable resin 90. Thus, the battery 4 is embedded in the resin 90, which forms a surface flush with the reverse surface of the circuit board 2. Further, the decorative sheet 6 is disposed on the reverse side of the circuit board 2. This process of embedding the battery 4 is executed on an IC card 10 as shown in FIG. 14, in which the lodging section 8 has been formed by injection molding.

Figure 15A:
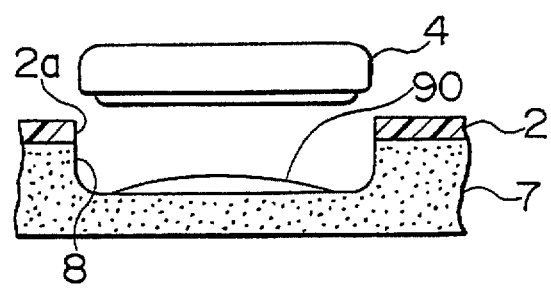
FIGS. 15A through 15D are sectional views showing the procedures for embedding the battery of the thin IC card of FIG. 13 in expandable resin.
Figure 15B:
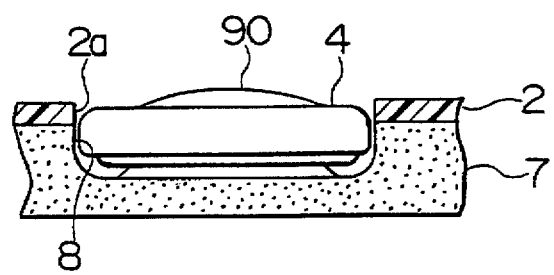
Figure 15C:
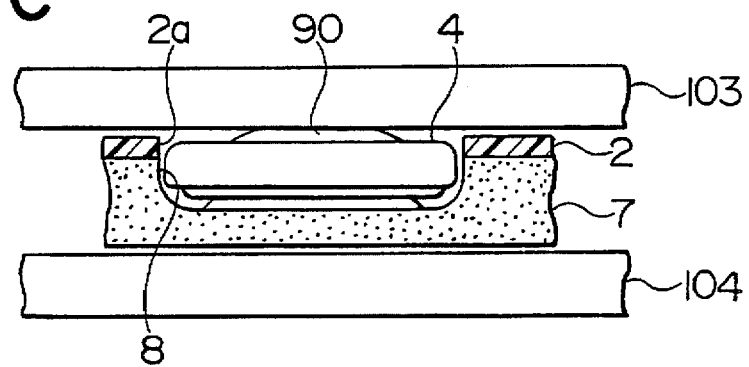
Figure 15D:
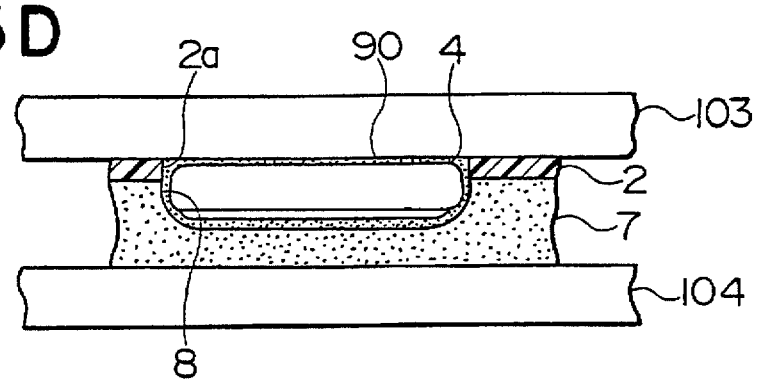
Figure 16:
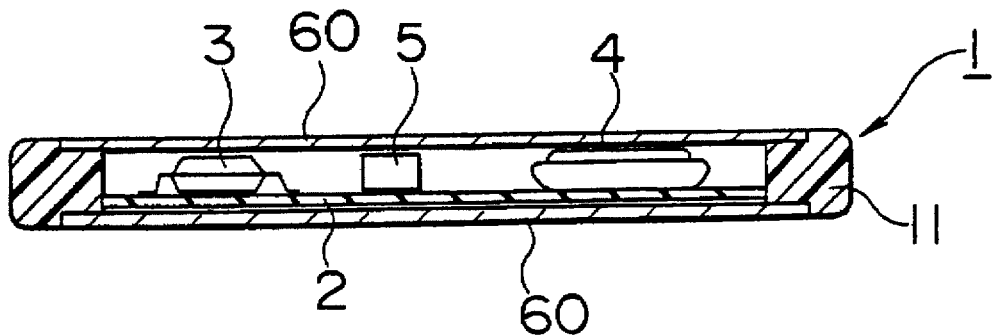
FIG. 16 is a sectional view showing a conventional thin IC card.
Figure 17:
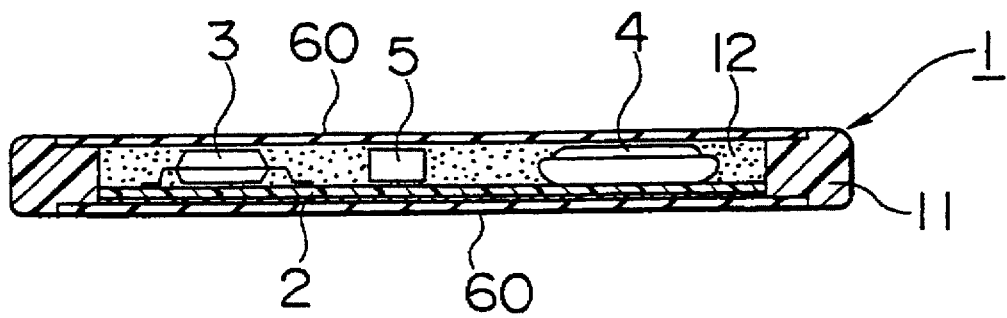
FIG. 17 is a sectional view showing another conventional thin IC card.

The battery embedding procedures will be described with reference to FIGS. 15A to 15D. First, as shown in FIG. 15A, unexpanded expandable resin 90 is poured in the lodging section 8 with its opening facing upward. Then, the battery 4 is put in the lodging section 8 and electrically connected to the battery-connection electrodes (not shown) of the circuit board in accordance, for example, with one of the above-described embodiments. Next, as shown in FIG. 15B, unexpanded expandable resin 90 is also poured over the battery 4 and, as shown in FIG. 15C, the entire IC card is held between upper and lower dies 103 and 104. In this condition, the resin 90 is allowed to expand and cure. FIG. 15D shows the resin 90 expanded and cured while the IC card is held between the dies. The volume of the expandable resin 90, poured both over and under the battery 4, increases to fill the gap around the battery 4, and cures in this condition. The dies cause the surface under which the battery 4 is embedded to become flat and flush with the reverse surface of the circuit board.

When the resin 90 is allowed to expand inside the lodging section 8 of the IC card with the battery 4 lodged therein, not only the lodging section 8 but also the recess 2c or the cutouts 2e are filled with resin 90, so that the resin 90 also protects the connecting section between the battery and the circuit board.

In this embodiment, a three-component-type low-temperature-curing epoxy resin was used as the expandable resin 90, which was composed of: a chief component consisting of an inorganic-powder filler material, a curing agent, and a blowing agent. When allowed to expand, this resin becomes a closed-cell foam body having a void volume of 20 to 50%. An amount of unexpanded expandable resin 90 corresponding to 60% of the calculated voids was applied to the spaces above and below the battery 4, and the entire card was held between lubricated dies. The resin was then allowed to expand and cure at 50° C. After the resin 90 had expanded and filled up the space around the battery 4, the expansion of the resin was restricted by the fastening pressure of the dies. In this condition, the expansion was completed along with the curing, and the configuration of the resin was fixed.

In this way, the battery can be embedded in the lodging section. Further, the surface of the lodging section under which the battery is embedded can be made flat and flush with the reverse surface of the circuit board, thus realizing an IC card of a completely solid type, the surface of which has even fewer irregularities. Further, since the battery 4 is secured inside the body of the IC card, that is, made integral with the IC card, the electrical-connection portion between the battery and the circuit board has a very high level of reliability with respect to vibrations of the IC card and other external forces.

Further, since the battery 4 is covered with the expandable resin 90, no stress due to contraction during curing of the resin is applied to the battery as in the case where the lodging section is filled with thermosetting resin or the like. In addition, since the battery is covered with closed-cell foam resin in such a way as to leave no surface of it exposed, the IC card is good for use even under unfavorable environmental conditions.

Although in the above embodiment a thermosetting-type expandable resin was used, the same effect can be obtained by using other types of expandable resins. However, in view of the fact that the IC card is to exhibit a flat surface with no irregularities, it is desirable to use a resin which is resistant to elastic deformation after it has expanded and cured.

As described above, in accordance with this invention, a through-hole portion at the edge of the battery lodging section is formed in the circuit board, on which the functional part is mounted, and this circuit board is embedded in the molding-resin section in such a way that its reverse surface is exposed. The battery lodging section is formed in the molding-resin section in correspondence with the through-hole portion of the circuit board, and the electrical connection of the circuit board to the battery is effected in the recess or cutouts formed on the circuit board, thereby realizing a thin IC card having a flat surface with no irregularities.

Since the battery is accommodated in the lodging section after the formation of the molding-resin section, the battery is free from damage from the heat generated during resin molding.

Further, since the battery lodging section is formed by resin molding, it can be formed into a desired configuration in accordance with the configuration of the battery.

In addition, by filling the gap between the battery and the lodging section with expandable resin, the surface of the card can be made even flatter. Also, the reliability of the electrical connection between the battery and the circuit board is improved.

What is claimed is:

1. A thin IC card having a built-in battery comprising:
   a circuit board having obverse and reverse main surfaces,
      a circuit pattern disposed on the obverse surface of the circuit board, a functional part mounted on the obverse surface of the circuit board and connected to the circuit pattern, and a through-hole in the circuit board including an edge;

a battery;

a unitary molded resin body in which the obverse surface of the circuit board and the functional part are embedded, the reverse surface of the circuit board not being covered by the molded resin body, the molded resin body including a battery lodging recess defined by and accessible through the through-hole in the circuit board and in which the battery is lodged; and battery connection means firmly supporting the battery in the battery lodging recess and electrically connecting the battery to the circuit pattern on the circuit board.

2. The thin IC card according to claim 1 wherein the battery connection means comprises:

a connection recess at the edge of the through-hole in the circuit board and indented into the molded resin body;

at least a pair of battery-connection electrodes disposed in the connection recess and electrically connected to the circuit pattern on the circuit board; and at least a pair of battery-connection terminals supporting the battery in the battery lodging recess and electrically connecting the battery to the battery-connection electrodes, the electrodes and the terminals being electrically connected to each other in the connection recess.

3. The thin IC card according to claim 1 wherein the battery connection means comprises:

at least a pair of cutouts in the circuit board at the edge of the through-hole;

at least a pair of battery-connection electrodes electrically connected to the circuit pattern on the circuit board and extending into the cutouts from the obverse surface of the circuit board; and at least a pair of battery-connection terminals supporting the battery in the battery lodging recess and electrically connecting the battery to the battery-connection electrodes, the electrodes and the terminals being electrically connected to each other in the cutouts.

4. The thin IC card according to claim 3 wherein the battery-connection electrodes are dome-shaped electrodes indented toward the molded resin body covering the cutouts on the obverse surface of the circuit board, the electrodes and the battery-connection terminals being electrically connected to each other in the cutouts.

5. The thin IC card according to claim 1 wherein the battery connection means comprises:

at least a pair of projections of the circuit board extending into the battery lodging recess of the molded resin body contacting the battery; and battery-connection electrodes on the projections contacting the battery.

6. The thin IC card according to claim 1 wherein a gap between the battery lodging recess and the battery is filled with an expandable resin forming a flat surface flush with the reverse surface of the circuit board.

7. The thin IC card according to claim 1 comprising a sheet bearing a decoration disposed on the reverse surface of the circuit board, the sheet and the molded resin body together forming a planar surface.

* * * * *